June 6, 1961 G. C. MESSENGER 2,987,658

IMPROVED SEMICONDUCTOR DIODE

Filed Jan. 10, 1958

INVENTOR.
GEORGE C. MESSENGER
BY
Herbert Epstein
AGENT

United States Patent Office 2,987,658

Patented June 6, 1961

2,987,658

IMPROVED SEMICONDUCTOR DIODE

George C. Messenger, Trappe, Pa., assignor to Philco Corporation, Philadelphia, Pa., a corporation of Pennsylvania Filed Jan. 10, 1958, Ser. No. 708,290
30 Claims. (Cl. 317—234)

This invention relates to asymmetrically conductive semi-conductor devices and more particularly to semiconductor diodes having improved noise figure, improved burn-out properties and improved frequency-response characteristics. Even more particularly it relates to semiconductor diodes which have unusually low conversion losses even at extremely high frequencies and hence are especially well suited for use as the non-linear elements of frequency converters intended for operation at these frequencies.

Because of the constantly increasing need for additional radio frequency channels to accommodate new communications services, and because its specific transmission characteristics make the extremely high radio frequency spectrum uniquely valuable for radar and other detection systems, intensive research is currently being directed toward developing superheterodyne receiving apparatus capable of relatively efficient operation in this frequency range (e.g. from 20 to 100 kilomegacycles per second). In superheterodyne apparatus intended to operate at these high frequencies it is customary to use a crystal diode as the non-linear element in the frequency conversion stage thereof, because its noise figure is substantially lower at these frequencies than those of thermionic tubes which might alternatively be employed, and accordingly the receiver utilizing the crystal diode is capable of a sensitivity higher than that of a receiver employing thermionic tubes.

However the conversion loss of such crystal diodes, and hence the noise figure of the frequency converter stages incorporating them, increases in direct proportion to an increase in the frequency of the radio-frequency signal supplied to these stages for conversion. Accordingly, to obtain superheterodyne reception at these extremely high frequencies at sensitivity levels comparable to those achieved by the best lower-frequency receivers, it is necessary to reduce the conversion losses of the crystal diodes utilized therein in proportion to the increase in reception frequency.

As described in my now-abandoned patent application Serial No. 496,134, filed March 23, 1955, entitled "Low Noise-Figure Crystal Rectifiers and Semiconductive Compositions Therefor," and assigned to the assignee of the present application, the conversion loss of a crystal diode having a conventional structural geometry can be reduced to the lowest value achievable for that geometry, by utilizing therein a crystal body of a specific novel composition. More specifically, for point-contact crystal diodes of conventional form, the lowest conversion loss for a given point contact is obtained where the semiconductive material of which the crystal member is composed contains a predetermined high concentration of impurity atoms of a single type, i.e. either donor or acceptor. Because the teachings of this copending patent application are pertinent to the present invention, they are discussed further hereinafter.

However, the conversion loss of a diode of conventional structural geometry is affected not only by the composition of its crystal body but also by the least transverse dimension of the point contact, varying in direct proportion to variations in the latter quantity. By "least transverse dimension" is meant the shortest distance between opposing segments of the periphery of the point contact. For example, where the point is wedge-shaped, the least transverse dimension is the smallest distance between opposing edges of this wedge; where the periphery of the point contact is elliptical, the least transverse dimension thereof is the minor axis of the ellipse; and where the point contact has a substantially circular periphery, the least transverse dimension is the diameter of this periphery. Accordingly, to achieve a minimal noise figure, it is necessary to reduce the least transverse dimension of the point contact to the smallest possible value. However, the extent to which this dimension can be reduced is limited by the additional requirements of mechanical stability of the whisker wire and adequate burnout rating of the diode. Specifically, it has been found that titanium whiskers having point radii of less than one micron are so unstable mechanically as to be unusable commercially. In addition, as the least transverse dimension of the point contact is reduced, the ability of the diode to withstand burnout which may be produced by signals of excessive intensity, is reduced proportionately. Accordingly, in diodes having the prior-art structural geometry, the requirements of low noise and high burnout rating conflict with one another.

From the foregoing it is clear that there is a limiting value below which the least transverse dimension of a whisker wire cannot be reduced without rendering the diode commercially unusable by reason of mechanical instability and excessive susceptibility to burnout. Thus the minimum value of the conversion loss and hence the noise figure of even those prior-art diodes utilizing my novel semiconductive material is ultimately determined by this limiting value of the least transverse dimension of the whisker wire.

In addition, the maximum frequency at which many prior art diodes are able to provide efficient rectification has heretofore been limited substantially by the properties of the semiconductive material utilized therein. More specifically, in many prior art diodes the semiconductive material is of such nature that the rectifying contact injects a substantial quantity of minority carriers. These minority carriers in turn serve to transport substantially all of the diode current. However, because these minority carriers travel primarily by a diffusion process, there is a substantial dispersion in the time of arrival of individual minority carriers at the ohmic contact of the diode. As a result, to a source of alternating current connected thereto, the terminals of the diode appear to be shunted by a capacitance of relatively large value. Consequently when signals of extremely high frequencies are applied to the terminals of the diode, they preferentially travel through this large apparent capacity instead of being rectified by the barrier resistance of the diode. As a result, the rectification efficiency of such diodes at these extremely high frequencies is very low.

Accordingly it is an object of my invention to provide an improved asymmetrically-conductive device.

Another object is to provide an improved semiconductor diode which is especially well adapted for operation at extremely high radio frequencies.

A further object is to provide an improved semiconductor diode, the conversion loss of which is substantially independent of the least transverse dimension of its rectifying contact.

An additional object is to provide an improved semiconductor diode which has excellent resistance to burnout as well as a low noise figure, even when used to rectify signals having an extremely high frequency.

Yet another object is to provide a semiconductor diode which has substantially higher rectification efficiency at very high frequencies than do many prior-art diodes.

A further object is to provide a semiconductor diode which is particularly useful as the non-linear element of a frequency converter arranged to operate in response to input signals having frequencies in the range of 20 to 100 kilomegacycles per second.

A still further object is to provide a semiconductor diode which is relatively simple to mass-produce and in addition has excellent resistance to burn-out as well as very low conversion loss at extremely high-frequencies.

In accordance with my invention the foregoing objects are achieved by the provision of a novel semiconductor diode which comprises a crystal body composed of one of the novel mono-crystalline semiconductive substances described in my now abandoned application Serial No. 496,134 and also described briefly hereinafter, and which additionally comprises means providing a rectifying connection to a first region of said body and means providing an ohmic connection to a second region of said body. As an important feature of the invention, the ohmic connection is oriented substantially parallel to the rectifying connection and is spaced therefrom by a distance sufficiently small that substantially all of the current flowing between the ohmic and rectifying connections in response to a forward-biasing voltage applied therebetween flows along substantially straight-line paths substantially perpendicular to these connections.

Under these conditions, and as an important result of my invention, the conversion loss of the diode is no longer dependent upon the dimensions of the rectifying connection, as it was in prior-art diodes, but now depends instead on the distance between the rectifying and ohmic connections. Because this distance can be made substantially smaller than the smallest practicable value for the minimum transverse dimension of the rectifying connection, the value of the conversion loss of my diode can be reduced to values hitherto unattainable, particularly at extremely high frequencies. Furthermore, because the conversion loss of my diode is substantially independent of the dimensions of its rectifying connection, the latter can be made substantially larger than heretofore, thereby increasing substantially the energy-handling capacity and therefore the burn-out rating of the diode.

Moreover, because my novel semiconductive material described in application Serial No. 496,134 is employed in my novel diode two additional significant results according to my invention are obtained. Firstly, because the density of majority carriers in my semiconductive material is unusually great, conduction through the diode is accomplished by the movement of substantially only these carriers. Under these conditions and by contrast to minority-carrier conduction, there are substantially no frequency-limiting dispersion effects. As a result, the frequencies at which the diode is capable of operating with high rectification efficiency are substantially higher than for most prior-art diodes. Secondly, and for reasons set forth in my application Serial No. 496,134 and reviewed below, each of my novel semiconductive materials has that composition producing substantially the lowest conversion loss attainable for its constituents. Therefore by using one of my materials in a diode having in addition the novel geometry set forth above, the diode thus obtained may have a conversion loss even lower than that obtained in the diodes described in my now abandoned application.

In all of the preferred embodiments of my invention, the ohmic and rectifying connections are each substantially planar.

In a more specific embodiment of the diode of my invention, the rectifying connection has a substantially circular periphery the radius of which is at least as great as, and preferably substantially greater than, the distance separating the rectifying connection from the ohmic connection. Because the specific type of rectifying contact utilized has little effect on the conversion loss of the diode, this contact may have one of several forms. For example, in those diodes intended for use at extremely high frequencies, a small-area rectifying connection, e.g a point contact, is employed, thereby to minimize the diode capacitance. In this regard a filamentary member may be employed having a point which abuts the body surface opposite the ohmic connection. In accordance with my invention, the least transverse dimension of this point is at least equal to twice the distance through the body to the ohmic contact at the region of abutment thereof. Specifically and as aforementioned, where the point has a generally circular periphery, the diameter of this point is the least transverse dimension thereof and is at least as great as and preferably substantially greater than the aforementioned distance.

Moreover, to enhance the mechanical and therefore the electrical stability of the structure, a segment of this filamentary member located intermediate the ends thereof is bonded to the surface of the semiconductive body by means of a substantially non-conductive cementitious material.

In a second preferred embodiment of my invention, the rectifying connection is provided by a surface-barrier electrode applied to a portion of the body surface opposing the ohmic connection. While such an electrode generally has a larger radius than does a point contact, this increase in radius does not, in my novel arrangement, increase the conversion loss of the diode. Accordingly this form of diode is especially useful for those applications where the capacitance of the diode need not be minimal but in which it is important that the diode have the high resistance to burnout and greater mechanical stability obtained by utilizing a rectifying contact of appreciable radius.

In still another preferred embodiment of my invention, the rectifying contact may comprise an alloy junction of substantially plane configuration. Because such junctions are formed by alloying the appropriate active impurity metal into the body, this type of structure has the advantage that the body region separating the rectifying connection from the ohmic connection may be substantially thicker and hence somewhat less susceptible to mechanical injury than are the preceding two embodiments, while providing nonetheless the same substantial improvement in the noise figure of the crystal.

In all embodiments of my novel diode, the crystal body thereof is constituted of my novel semiconductive material described in my application Serial No. 496,134. Accordingly the composition of this material is now reviewed briefly. As is known to the art, significant impurities added to a semiconductive material supply substantially unbound or "free" charge carriers to the material. More specifically, where the significant impurity is a donor impurity its atoms supply conduction electrons to the material, while where the significant impurity is an acceptor impurity its atoms supply holes thereto. These charge carriers in each instance exhibit a mobility $b$, i.e. a given velocity under the influence of unit electric field applied to the semiconductive material, which is dependent upon the identity of the semiconductive material, the type of charge carrier, i.e., hole or electron, supplied by the significant impurity, the temperature at which the composition is maintained and the density N of free charge carriers. By "density of free charge carriers" is meant the number of free charge carriers contained in a unit volume of the composition. In this connection, subsequent references to "charge carriers" will be understood to be to such free charge carriers.

Moreover, it is found that when the density N of the charge carriers in the composition exceeds a predetermined value $N_D$, the composition exhibits degenerate properties. These properties manifest themselves most obviously, in small-area contact rectifiers made from said composition, by a low back-to-forward impedance ratio, e.g. by an impedance ratio of less than ten to one, as well as by a high noise figure. Since such properties render a crystal possessing them worthless for use in a mixer diode, it is essential that the carrier density N of the crystal member of my diode be less than $N_D$.

As disclosed in my above-identified application, diodes having consistently low noise figures can be obtained by constituting the material from which the crystal bodies thereof are fabricated of substantially monocrystalline germanium or silicon alloyed with a specific concentration of atoms of significant impurities of a given impurity type. In particular this specific concentration of atoms is such that, at a given temperature, the charge carriers supplied by said impurity atoms are present in a critical density less than $N_D$ for which the quantity $N^{1/2}b$ has the greatest value which it can possess for N less than $N_D$. In practice, at the temperatures normally prevailing within electronic equipment, each atom of significant impurity produces approximately one charge carrier on the average. Hence, in the preferred forms of my semiconductive material, the aforesaid specific concentration of impurity atoms is substantially equal to the above-defined critical density of charge carriers.

In one preferred form, my crystal body is composed of substantially monocrystalline germanium containing the donor impurity antimony in a concentration substantially equal to $2\times10^{18}$ atoms of antimony per cubic centimeter of semiconductive material. This concentration of antimony atoms can also be expressed as 0.0074 percent by weight or 0.0044 atomic percent. In a second preferred form, my crystal body is composed of substantially monocrystalline silicon containing the acceptor impurity boron in an amount substantially equal to $3.4\times10^{18}$ atoms of boron per cubic centimeter of semiconductive material. This concentration of boron atoms is equivalent to 0.0025 percent by weight, or 0.0066 atomic percent.

While the foregoing concentrations of significant impurities are, in each case, preferred values which produce substantially the lowest noise figures, I have found in practice that relatively low noise figures are also obtainable for impurity concentrations having values differing slightly from the aforementioned preferred values. Specifically, in the case of germanium concentrations of antimony in the range of 0.0011 to 0.037 percent by weight (0.00066 to 0.022 atomic percent) will yield crystals having noise figures of 10 or less. Similarly, in the case of silicon, concentrations of boron in the range of 0.00074 to 0.0037 percent by weight (0.0019 to 0.0097 atomic percent) will yield crystals also having low noise figures. It is found that germanium and silicon bodies respectively containing the above-stated percentages of donor and acceptor impurities have respective resistivities at room temperature within the ranges 0.0036 ohm-centimeter to 0.013 ohm-centimeter, and 0.011 to 0.034 ohm-centimeter. Moreover, because the specific identity of the donor or acceptor impurity used to provide the free charge carriers is unimportant insofar as conversion loss is concerned, the specific impurity substances named above, i.e. antimony and boron respectively, may either be replaced by, or used in combination with, other donor or acceptor impurities. For example, the antimony in the germanium may be replaced by or used in combination with other elements present in group VB of the periodic table, namely, nitrogen, phosphorus, arsenic and bismuth, whereas the boron in the silicon may be replaced by or used in combination with other elements present in group IIIB of the periodic table, namely aluminum, gallium, indium and thallium. Where such combinations of impurity substances are used, it is only important that the total concentration of impurities be one which lies within the above-recited critical range.

Other advantages and features of the invention will become apparent from a consideration of the following detailed description taken in connection with the accompanying drawings, in which.

Figure 1:
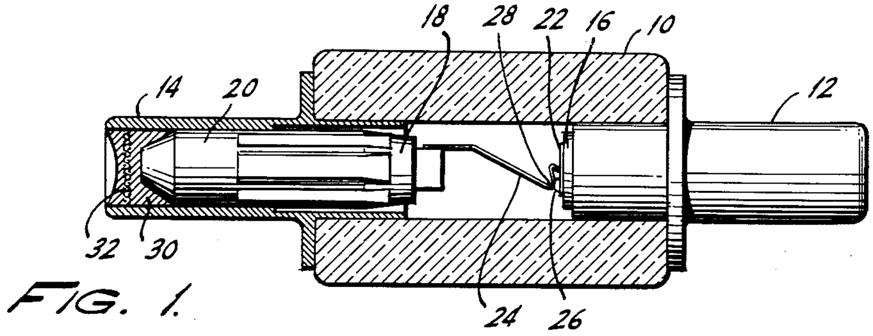
FIGURE 1 is a view, partly in section, of a point-contact diode according to my invention.

In FIGURE 1 there is shown, partially in cross-section, a diode cartridge assembly of the coaxial type embodying a crystal rectifier unit according to my invention. This assembly is especially useful as the non-linear element in a frequency converter for very high frequency signals. While the cartridge assembly may take any one of a variety of forms, some of which may be conventional, the specific structure illustrated in FIGURE 1 has been found to be advantageous.

This structure comprises a cartridge case 10 composed of an alkaline lead silicate glass and having substantially the form of a hollow cylinder. A first pin member 12 is inserted into one end of case 10 and a second pin member 14 is inserted into the other end thereof. Pin members 12 and 14 are preferably made of a metal whose surface is wettable by the glass of cartridge case 10 when this glass is heated above its melting temperature, and which has a cooling curve closely matching that of the glass. One such metal is a cobalt-nickel-iron alloy manufactured by the Stupakoff Ceramic and Manufacturing Company, Latrobe, Pennsylvania, under the trade name Kovar. The composition and properties of this metal are discussed in detail in the publication, "Microwave Magnetrons," edited by George B. Collins and published by McGraw-Hill Book Company, Inc., New York, 1948, at pages 676 to 682, section 17.5.

Pin members 12 and 14 are each bonded to cartridge case 10 by heating the case and the pin members to a temperature above the melting point of the glass of case 10, thereby causing the glass to flow over and adhere to those surfaces of pin members 12 and 14 which are conterminous with surfaces of case 10. This process is preferably carried out in an atmosphere of inert gas, e.g. argon, to inhibit oxidation of pin members 12 and 14.

Pin members 12 and 14 are each hollow so as to accommodate respectively a crystal-bearing stud 16 and a whisker-bearing stud 18. Each of these studs is splined, thereby to permit a tight press-fit to be made between the stud and its respective pin member without undue deformation of the latter. In addition each stud has a chemically pure lead gasket 20 cast onto one end thereof and machined to fit the interior of the pin member. This gasket serves to seal the interior of glass cartridge 10 from the external atmosphere and alloys readily with the sealing solder subsequently applied thereto in the manner hereinafter described. In practice studs 16 and 18 may each be made of brass which is silver-plated to provide a low resistance electrical connection to the pin member within which it is inserted.

Prior to its insertion into pin member 12, crystal-bearing stud 16 has soldered to one end thereof a cyrstal body 22 having a composition and a geometry according to my invention. The various possible compositions of my novel bodies have already been discussed above; the composition of the solder and the geometry of body 22 are discussed more fully hereinafter. In the present specific embodiment, the crystal body is composed of substantially monocrystalline germanium containing about 0.0044 atomic percent of a donor impurity, e.g. about 0.0074 percent by weight of antimony.

The surface of crystal member 22 is then polished with suitable abrasives to an optically smooth finish. Next, stud 16 is forced into pin member 12 to an extent such that crystal body 22 affixed to stud 16, protrudes slightly beyond the end of member 12 located within case 10. Then stud 16 is solder-sealed to pin member 12. This is accomplished by initially flowing into the end of pin member 12 an amount of solder somewhat insufficient to fill completely the hollow therewithin. Typically this solder is composed of 60 percent by weight of tin and 40 percent by weight of lead. Then, to strengthen the seal, a screening (not shown), which may be composed of nickel wire, is inserted into the depression remaining within pin member 12, the solder already therewithin remelted, and additional solder added in a quantity sufficient to immerse the screening therein. Thereafter, the solder is cooled below its melting point. Alternatively, the seal may be fabricated by filling the hollow in pin member 12 with molten solder, then, while maintaining the solder in a fluid state, forcing the screening through the molten solder, and finally, cooling the solder below its melting point. This method is advantageous because it causes any pockets of gas entrapped in the solder to be displaced inwardly and away from the outer surface of the solder, and hence assures a good hermetic seal. Because this method is described and claimed in copending application Serial No. 527,456, now Patent No. 2,832,132, filed on August 10, 1955, by J. W. Stineman, entitled "Method of Sealing," and assigned to the assignee of the present invention, no further description thereof is deemed necessary herein.

Next a filamentary contacting member, e.g. a whisker 24, which in the present embodiment is preferably composed of titanium, is spot-welded to stud 18 and is highly sharpened on a grindstone in a manner such that a substantially circular point is formed thereon the radius of which bears to the thickness of the semiconductive body the predetermined relationship according to my invention, which is set forth hereinafter. Whisker 24 is then crimped into the proper shape. A droplet of cement 26, which is preferably substantially nonconductive, is next placed upon a segment of whisker 24 which is intermediate the part thereof secured to stud 18 and the pointed end thereof, i.e. upon a crimp 28 bent into whisker 24. This cement may be composed of one of several nonconductive adhesive substances, e.g. one of the epoxy or ethoxy resins such as that known as Hysol 6020 and manufactured by Houghton Laboratories. The cement utilized should possess low shrinkage on setting and curing, a low temperature coefficient of expansion, be preferably non-hygroscopic, and provide rigid bonds to both metals and semiconductors. For the present purposes I prefer to utilize a mixture of the above-mentioned Hysol 6020 with nearly an equal amount by weight of cerium oxide or silica, to which mixture a suitable hardener is added just prior to application.

Whisker-bearing stud 18 is then forced into pin member 14 until contact is made by the sharpened point of whisker 24 with the surface of crystal body 22 at a position critically determined in accordance with the invention and described further hereinafter. Stud 18 is then advanced another 0.0015 inch in order to attain correct whisker pressure and contact area.

In order that the cement droplet 26 may bond whisker 24 firmly to the surface of crystal body 22, thereby to stabilize the position of whisker 24 with respect to this surface, the entire unit is positioned within a centrifuge, with pin member 12 pointed radially away from the center thereof, is next accelerated rapidly (e.g. to 270 times the acceleration of gravity in 15 seconds) and is then decelerated slowly. The cartridge is then removed from the centrifuge and the droplet permitted to harden under appropriate temperature conditions.

After cement droplet 26 has been suitably hardened, the cavity remaining between the respective ends of pin member 14 and stud 18 positioned therewithin is sealed with a solder 30 reinforced by a nickel screening 32 in one of the manners described above.

To "form" the rectifier, there is applied, between pin members 12 and 14, a forward biasing voltage the value of which is varied to produce a direct current which first increases linearly and in two seconds from zero to 155 milliamperes, remains at 155 milliamperes for five seconds, and then decreases linearly and in two seconds to zero intensity.

Figures 2, 3:
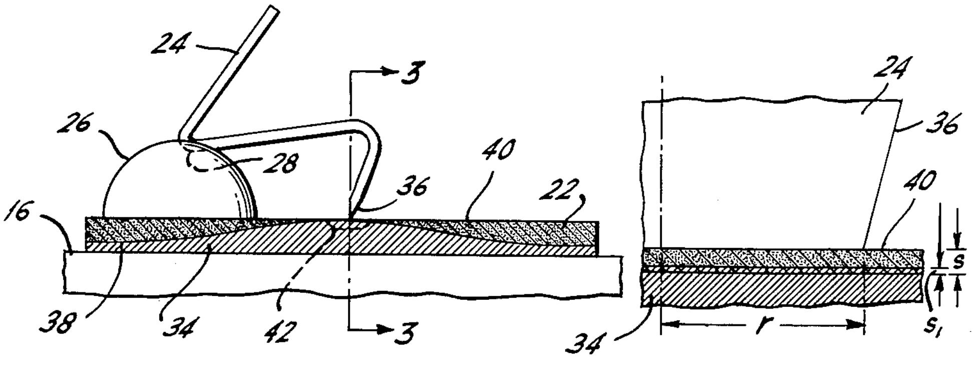
FIGURE 2 is a view, partly in section and in considerable enlargement, of a portion of the diode of FIGURE 1.
FIGURE 3 is a sectional view of FIGURE 2, illustrating the novel geometric relationships utilized in the diode of FIGURE 1.

FIGURE 2 illustrates in considerable enlargement a cross-section of that portion of the diode shown in FIGURE 1 comprising crystal-bearing stud 16, semiconductive body 22, the solder 34 securing body 22 to stud 16, the point-contacting end 36 of whisker 24, and the cement droplet 26 securing crimp 28 of whisker 24 to body 22. In particular, FIGURE 2 illustrates in section the critical positioning of the point 36 of whisker 24 with respect to body 22 and the geometry of body 22, both in accordance with my invention. Typically body 22 may be rectangular in form, with square major surfaces 100 mils on a side, and may have a thickness of 5 mils at its edges. Importantly body 22 has a first surface 38 in which a concavity is formed and a second surface 40 which is substantially plane.

In accordance with my invention, this concavity has a surface region 42 which is substantially plane and parallel to the second surface 40 of body 22, and is separated from surface 40 by a distance no greater than, and preferably substantially less than, one-half the least transverse dimension of the portion of point 36 which abuts surface 40 of body 22. In FIGURE 2, surface region 42 is substantially symmetrically disposed with respect to a section line 3—3 which passes through surface 40 substantially perpendicularly thereto. Moreover the portion of point 36 abutting body surface 40 has a substantially circular periphery centered on section line 3—3 and having a radius of the order of eight to ten times the thickness of body 22 along line 3—3. In a typical case, the radius of the point of whisker 24 may be of the order of four or five microns, while the thickness of body 22 along line 3—3 may be of the order of 0.5 to 1 micron.

The concavity in surface 38 of body 22 is produced readily by employing one of the jet electrolytic etching techniques described and claimed in the following copending applications: Serial No. 472,824, filed December 3, 1954, by J. W. Tiley and R. A. Williams, and entitled "Semiconductive Devices and Methods for the Fabrication Thereof," Serial No. 449,347, now Patent No. 2,875,141, filed August 12, 1954, by R. N. Noyce, and entitled "Method and Apparatus for Use in Forming Semiconductive Structures," and Serial No. 424,704, now Patent No. 2,875,140, filed April 21, 1954, by T. V. Sikina, entitled "Method and Apparatus for Producing Semiconductive Structures." All of the latter applications are assigned to the assignee of the present application. Because these electrolytic machining techniques are described in considerable detail in the foregoing copending applications, no further discussion thereof is believed to be necessary herein.

To provide substantial mechanical support for the extremely thin concave region of crystal body 22 as well as to provide means for making a low-resistance ohmic connection between body 22 and stud 16, the concavity formed within body 22 is filled with solder 34 containing impurity substances of substantially the same type as those contained within body 22. In the present instance, inasmuch as body 22 is composed of n-type germanium, solder 34 comprises a substantial concentration of donor impurities. For example solder 34 may be composed of approximately 40 percent by weight of lead, 40 percent by weight of tin, 15 percent by weight of bismuth and 5 percent by weight of one or more of the elements arsenic, phosphorus or antimony. Because bismuth, arsenic, phosphorus and antimony are donor impurities, this solder forms a substantially ohmic connection with n-type germanium when alloyed thereinto.

In initially applying solder to a crystal body 22 and in subsequently securing body 22 to stud 16, the following procedure may be employed: An amount of solder just sufficient to fill the concavity in body 22 is placed within this concavity and is heated just sufficiently to melt the solder, thereby causing the solder to flow within the concavity and adhere to body 22. The solder is then permitted to refreeze, thereby forming the solder mass 34. This mass is abutted against stud 16, which may be tinned with the same solder. Then stud 16 and semiconductive body 22 are heated just above the melting point of the solder, e.g. by utilizing a radiative heating element (not shown), for a time just sufficient to melt the solder. When the solder is seen to be melted, the heating is discontinued, and body 22 and stud 16 are permitted to cool below the melting point of the solder. By performing the foregoing steps the solder 34 is caused to alloy very slightly, e.g. to a depth of 0.01 micron, into the germanium contiguous thereto, thereby providing a connection between body 22 and stud 16 having substantially ohmic properties and securing body 22 to stud 16.

Referring now to FIGURE 3, there is shown therein a greatly enlarged fragmentary cross-sectional view of a portion of FIGURE 2, taken along section line 3—3 of the latter figure. As shown in FIGURE 3, region 42 is bounded by substantially plane and parallel surface portions separated by a distance $s$, and whisker point 36 abuts surface 40 of body 22. As aforementioned, the rectifying contact made by point 36 with surface 40 has a substantially circular periphery; in FIGURE 3, this periphery is indicated to have a radius $r$. In accordance with a preferred form of the invention, the radius $r$ of point 36 is substantially greater than the thickness $s$ of body 22 in region 42, e.g. 8 to 10 times as great.

As aforementioned, solder layer 34 is alloyed into body 22; in FIGURE 3, the depth of this alloying is indicated as $s_1$. Typically, the thickness $s$ of region 42 may be 0.5 micron, while the depth of alloying $s_1$ thereinto may be 0.01 micron. However, it is within the contemplation of my invention that region 42 may be substantially thicker than 0.5 micron, e.g. one or more microns. Where region 42 of body 22 is relatively thick, a deeper alloying of solder 34 into body 22 is preferably employed to cause the surface of the ohmic connection provided by solder 34 to be located within 0.5 micron of the rectifying connection provided by point 36. This deeper alloying may be accomplished readily either by prolonging the time during which the solder is maintained molten, or by using a relatively higher temperature for soldering, or both.

As aforementioned I have found, in accordance with my invention and in marked contrast to the performance of diodes having prior-art structures, that when the least transverse dimension of the rectifying contact, e.g. the diameter of the point contact, is at least as great as, and preferably greater than, twice the thickness of the semiconductive body, the noise figure of the diode becomes substantially independent of the dimensions of the rectifying contact and depends substantially only on the thickness of the portion of the semiconductive body interposed between the rectifying contact and the ohmic contact. While I do not wish to be bound by any theory, the following explanation of this phenomenon is offered to provide a clearer understanding of my invention. To make this explanation simple to understand, it will be assumed that the rectifying contact has a circular periphery. However it is to be understood that similar explanations may be made with respect to rectifying contacts whose peripheries have non-circular shapes.

The conversion loss of a semiconductor diode varies in direct proportion to the product of the barrier capacitance of the diode and the spreading resistance thereof. In prior art point-contact diodes, wherein the radius of the point is substantially smaller than the thickness of semiconductive material interposed between the point and the ohmic contact of the diode, the lines of current flow within the semiconductive body are curved and extend radially into the body from the point contact. Under these conditions, it has been found that the spreading resistance of the diode varies in inverse proportion to the first power of the radius of the point contact. However, the barrier capacitance of the diode varies in direct proportion to the area of the point contact; thus for a circular point contact, the barrier capacitance varies in direct proportion to the square of the radius of the rectifying contact. Accordingly it is seen that, for a prior-art diode of the form described, the product of the spreading resistance and barrier capacitance, and hence the noise figure of the diode, varies in direct proportion to the radius of the rectifying contact.

By contrast, where in accordance with the invention the thickness of the portion of the semiconductive body interposed between the rectifying contact and the ohmic contact is no greater than, and preferably less than, the radius of the rectifying contact and the ohmic and rectifying contacts are plane and parallel to one another, the pattern of current flow through the semiconductive body is significantly different from the aforedescribed flow through the body of the prior-art diode. Specifically, instead of being curved and emanating radially from the rectifying contact as in the prior-art diode, substantially all the lines of current flow in my novel diode emanate perpendicularly to the rectifying contact. Moreover the latter lines are substantially straight and parallel to one another and hence are substantially perpendicular to the ohmic contact as well as the rectifying contact. Under these conditions, the spreading resistance of my novel diode varies in inverse proportion to the area of the rectifying contact and in direct proportion to the distance between rectifying and ohmic contact. Accordingly, for a circular rectifying contact, the spreading resistance of my diode varies in inverse proportion to the square of the radius of this contact; in contrast the spreading resistance of the prior-art diode varies in inverse proportion to the first power of this radius. However, in both diodes, the barrier capacitance varies in direct proportion to the square of the radius of the rectifying contact. Accordingly, in my novel diode and in accordance with my invention, the product of the barrier capacitance and spreading resistance is independent of the radius of the rectifying contact, and varies in direct proportion to the distance through the semiconductive body between the ohmic and rectifying contacts. Because in practice this distance can be made substantially smaller than the minimum practicable radius of the rectifying contact, diodes having my novel structure are capable of exhibiting noise figures at extremely high frequencies which are substantially lower than those exhibited at these frequencies by even the best prior-art diodes. Moreover even at lower frequencies, e.g. 10 kilomegacycles per second, diodes may be fabricated in accordance with my invention with point contacts having substantially larger radii than heretofore, without increasing the noise figures thereof. Accordingly it is now feasible to manufacture crystal diodes having superior burnout characteristics, by reason of their having larger rectifying connections, while achieving simultaneously noise figures equal to or better than those achieved by prior-art diodes.

In addition, because my point-contact diode utilizes one of my novel monocrystalline materials, in the present instance monocrystalline germanium doped with antimony to a concentration of 0.0074 percent by weight, it is characterized not only by an extremely low noise figure but also by excellent high frequency response. The latter result is achieved because conduction through the diode is carried out only by majority carriers, which in the present instance are electrons.

All of the preceding discussion has related to a point-contact diode according to my invention. However it is by no means necessary that the rectifying connection to the semiconductive body of my novel diode be a point contact. In this regard, reference is now made to FIG- URE 4, which illustrates a second form of my novel diode differing structurally from my point-contact diode in that it comprises a rectifying connection, e.g. a surface-barrier electrode, the radius of which may be substantially larger than that of a point contact.

Figure 4:
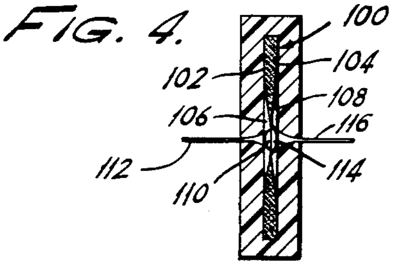
FIGURE 4 is a diagrammatic representation, partially in section, of a second diode according to my invention.

More specifically, the novel diode of FIGURE 4 comprises a semiconductive wafer 100 having substantially plane and parallel surfaces 102 and 104. Substantially coaxial depressions 106 and 108 are formed respectively in surfaces 102 and 104 of wafer 100 in a manner such that the surface portions of depressions 106 and 108 adjoining their common axis are substantially plane and parallel to one another. In a specific instance, wafer 100 may be composed of substantially monocrystalline n-type germanium containing 0.0074 percent by weight of antimony, as is the crystal body of my point-contact diode specifically discussed above. The latter material is one of those described in my now-abandoned patent application Serial No. 496,134. Depressions 106 and 108 may be formed readily within semiconductive body 100 by employing one or more of the various jet electrolytic etching techniques described hereinbefore and taught in the above-identified patent applications of Tiley and Williams, Noyce, and Sikina. Typically the thickness of wafer 100 between the plane parallel surface portions of depressions 106 and 108 may be of the order of 0.5 to 1 micron.

After depressions 106 and 108 have been formed, a rectifier electrode 110 is applied coaxially to the surface of one of them. Where, as in the present instance, wafer 100 is composed of n-type germanium, rectifier electrode 110 may be a surface-barrier electrode composed of indium and produced by jet electroplating an indium dot upon the surface of, and coaxially with, depression 106.

To inhibit substantially completely the formation within wafer 100 of solution cavities, which might otherwise be caused under high-temperature operating or storage conditions by the dissolution of portions of wafer 100 into the indium electrode overlying it, electrode 110 may be coated with a substance having a slightly lower melting point than the indium electrode (155° C.) and supersaturated with germanium. In practice this substance is applied to electrode 110, melted at a temperature below 155° C., and cooled below its own melting point. As a result, the substance is bonded intimately with electrode 110 and provides for this electrode an auxiliary source of germanium. Because indium electrode 110 now has an auxiliary source of semiconductive material in the coating and because the solubility of germanium in indium is relatively low, the substance inhibits greatly the dissolution of germanium from wafer 100 by electrode 110.

In the present instance wherein electrode 110 is composed of indium, the coating material may be a cadmium-indium eutectic solder supersaturated with germanium. Such a solder may be prepared by rapidly quenching, from a temperature of about 400° C., a melt containing a eutectic mixture of cadmium and indium as well as about one percent by weight of germanium. In addition to inhibiting solution cavities, this solder is used in the present instance to secure a wire lead 112 to surface-barrier electrode 110. Because the foregoing method of inhibiting solution cavities is set forth fully in the copending patent application of John Roschen, Serial No. 611,829, now U.S. Patent No. 2,930,949, filed September 25, 1956, entitled "Semiconductive Device and Method of Fabrication Thereof," and assigned to the assignee of the present invention, no further discussion of this point is deemed necessary herein.

It is to be understood that where this form of my diode is intended for operation at temperatures only of the order of room temperature, precautions need not be taken to prevent formation of solution cavities. Accordingly, the solder used to secure wire lead 112 to electrode 110 may alternatively consist in such cases of a germanium-free material, e.g. a eutectic indium-cadmium alloy.

On the surface of wafer 100 opposing that to which the surface barrier electrode 110 is applied, an ohmic connection 114 is formed. This connection may be formed by shallowly allowing into the surface of depression 108 a dot of a solder which may have the composition set forth hereinbefore with respect to solder 34 (see FIGURE 2) of my point-contact diode. Electrical contact is then made to connection 114 by means of a wire lead 116 which may be affixed thereto with the same solder or with a solder having a slightly lower melting point.

To protect from mechanical stress the extremely thin region of wafer 100 to which surface-barrier electrode 100 and ohmic connection 114 are affixed, and to protect the surfaces of wafer 100 from contamination by noxious ambients present in the atmosphere, wafer 100 may be encapsulated in a body of an inert plastic having a coefficient of thermal expansion relatively close to that of wafer 100 and having satisfactory dielectric properties at the frequencies at which the diode is to be operated. Such a material for example may be one of the epoxy resins referred to hereinbefore and sold under the trade name of Hysol by the Houghton Manufacturing Company. The latter resins are typically composed of the product produced by combining bisphenyl and epichlorohydrin, and in this instance may be filled with finely divided mica to improve the thermal conductivity properties of the plastic. Typically rectifying electrode 110 and ohmic connection may each have a radius of 125 microns, i.e. about 5 mils. If desired, ohmic connection 116 may have a somewhat larger radius than rectifying electrode 110.

Because of its novel structure in accordance with my invention, wherein the spacing between ohmic and rectifying connections is not greater than and preferably is substantially less than the radius of the rectifying connection, this form of my diode has substantially the same low noise-figure as that exhibited by diodes having much smaller rectifying connections. Nonetheless, where the diode is to be used as a rectifier of very high-frequency alternating currents, it has been found desirable to limit the radius of the rectifier electrode to 125 microns. This limitation is imposed because, where the rectifier electrode has a substantially larger radius, the capacitance of the diode becomes so large that a substantial fraction of the alternating current supplied thereto is transmitted through the diode without rectification. Of course, where the diode is to be used to rectify only low-frequency alternating current, the magnitude of its barrier capacitance becomes a less critical quantity, and the radius of the rectifier electrode need not be restricted in this manner.

Figure 5:
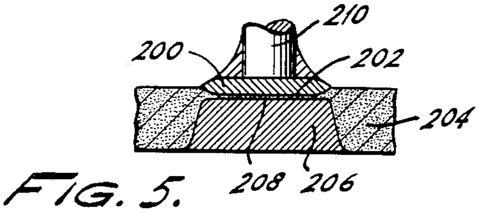
FIGURE 5 is a diagrammatic representation, partially in section, of a third diode according to my invention.

In still another diode according to my invention and illustrated diagrammatically in FIGURE 5, the rectifying contact is an alloy junction connection 200 having a substantially planar rectifying junction 202 positioned within a semiconductive body 204 which may also be composed of substantially monocrystalline germanium containing about 0.0074 percent by weight of antimony. Typically junction connection 200 may be composed of indium and may typically have a diameter of 125 microns. One technique for forming junction connections such as 200 is described in the paper, "Uniform Planar Alloy Junctions for Germanium Transistors," by C. W. Mueller and N. H. Ditrick, published in the RCA Review for March 1956, at pages 46 to 56, and accordingly no further discussion of this technique is deemed necessary herein. The diode also comprises an ohmic connection 206 having a substantially planar surface which is substantially parallel to rectifying junction 202 and is separated therefrom by an extremely small distance (e.g. 0.5 to 1 micron) not greater than, and preferably substantially smaller than, the radius of the rectifying connection.

To form ohmic connection 206, there is first produced in body 204 a depression which preferably is substantially coaxial with junction connection 200, and has a surface 208 which is substantially parallel to rectifying junction 202. Surface 208 preferably has a least transverse dimension at least equal to the diameter of junction 202 and is typically spaced from junction by about one micron. Such a depression may be formed readily either by the back-biased jet-etching process taught in co-pending application Serial No. 418,887, now Patent No. 2,846,346, filed March 26, 1954, by W. E. Bradley, entitled "Electrical Method and Device," or by the punch-through-voltage-controlled jet-etching process taught in copending application Serial No. 575,159, filed March 30, 1956, by W. E. Bradley and John Roschen, and entitled "Electrochemical Method and Apparatus," both of which applications are assigned to the assignee of the present application. After the depression has been formed in body 204, it is then substantially filled with a solder 206 which may have the composition set forth above with respect to solder 34 (see FIGURE 2). In practice solder 206 is heated for a short time to a temperature slightly above its melting point, and is then permitted to refreeze. This procedure causes solder 206 to alloy into germanium body 204 for a small distance, i.e. 0.01 micron, thereby providing an ohmic connection to the semiconductive body as well as substantial mechanical support for the thin portion thereof lying between junction 202 and surface 208. The diode assembly may then be mounted in a holder similar to that of FIGURE 1. Alternatively it may be provided with wire leads such as a lead 210 shown soldered to rectifying connection 202, and encapsulated in an insulating plastic (not shown) in the manner shown in the arrangement of FIGURE 4.

The diode of FIGURE 5 is particularly advantageous in that the thickness of body 204 above the plane surface of the ohmic connection may be substantially greater than the thickness of semiconductive material separating junction 202 from surface 206. This is true because alloy junction connection 200 per se may be alloyed relatively deeply into body 204 since it is only required by the invention that the distance between the rectifying junction 202 of connection 200 and surface 208 be equal to or less than the radius of junction 202. Accordingly this form of my diode is less susceptible to breakage during fabrication while also possessing a low noise figure.

Figure 6:
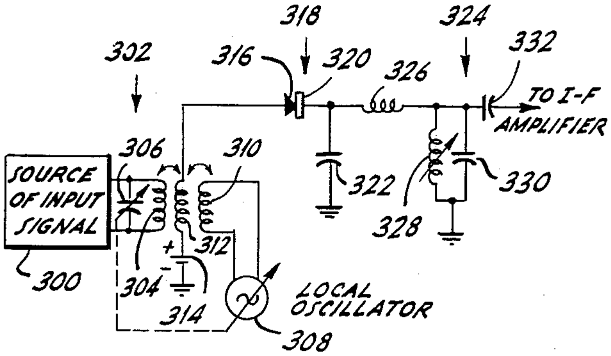
FIGURE 6 is the schematic diagram of a frequency conversion arrangement including a diode according to my invention.

I have found that, in operation, germanium diodes according to my invention usually exhibit the lowest noise figures when a forward-biasing voltage of 0.1 to 0.2 volt D.C. is applied thereacross. In this regard, FIGURE 6 illustrates a mixer circuit incorporating such a biasing arrangement and in which my germanium diodes may be used to provide low-noise performance. Referring now to FIGURE 6, it is seen that this mixer circuit comprises a source 300 of an input signal which in practice may be a sinusoidal wave of ultra-high radio frequency. Source 300 is coupled to a circuit 302 comprising an inductor 304 and a variable capacitor 306 and tunable to the frequency of the signal supplied by source 300. In addition the mixer circuit comprises a local oscillator 308 which supplies to an inductor 310 a local oscillation signal, the frequency of which is adjustable to differ by a predetermined fixed amount from the frequency of the input signal supplied by source 300. To achieve this frequency tracking, the variable element of capacitor 306 is ganged to the frequency-controlling element of local oscillator 308. The input and local oscillation signals are combined additively across a summing inductor 312 to which inductors 304 and 310 are each electromagnetically coupled. In addition, one terminal of summing inductor 312 is connected to a point at reference potential by way of a source 314 of positive voltage, while the other terminal of inductor 312 is connected to the anode 316 of a diode 318 constructed in accordance with my invention. The cathode 320 of diode 318 is coupled to a point at reference potential by way of a by-pass capacitor 322 the value of which is such that it presents a low reactance to signals having frequencies of the order of those of the input and local oscillation signals while presenting a relatively high reactance to signals having a frequency equal to the difference between the latter two frequencies. Cathode 320 of diode 318 is coupled in addition to one terminal of an output circuit 324 by way of a choke coil 326 which is operative to block transmission of radio-frequency and local oscillation signals without however attenuating to any significant extent the difference-frequency signal. The other terminal of output circuit 324 is connected to a point at reference potential. Output circuit 324 is constructed and arranged to select the difference-frequency signal. To this end circuit 324 comprises a variable inductor 328 and a capacitor 330 interconnected in parallel relationship and tuned to the difference frequency. In addition to remove the D.-C. component from the output signal of the frequency converter and to couple the converter to succeeding stages of the apparatus incorporating the converter, a coupling capacitor 332 is connected to the junction of inductor 326 and output circuit 324. Importantly, in order to achieve especially low noise performance, the source of positive voltage 314 connected in series relationship with summing inductor 312 is arranged to have an output voltage between 0.1 and 0.2 volt D.-C. The amplitude of the incoming signal may typically be of the order of microvolts whereas the amplitude of the local oscillation signal may be of the order of 0.45 volt. Under these conditions, the noise figure of the described converter is particularly low. It is to be understood that, while my novel diode performs especially well in converter circuits of the above-described structure, it may be used profitably in a variety of other circuit arrangements the nature of which will be apparent to those skilled in the art. It is further to be understood that, while the above-described frequency-converter is described as being constructed of lumped-parameter elements, it may equally well be constructed of wave-guide elements which are operationally equivalent to these lumped-parameter elements and are appropriate to the frequencies of the radio-frequency and local-oscillation signals.

While each of my three novel diodes specifically described above has been stated to comprise a crystal body composed of germanium containing about 0.0044 atomic percent of antimony, it is to be understood that my invention is by no means limited to diodes whose crystal bodies have this specific composition. On the contrary, the diodes of my invention may alternatively comprise crystal bodies having any one of the several other novel compositions described both above and in my application Serial No. 496,134. For example, even where an n-type germanium body is desired, the impurity substance need not be antimony or merely antimony, but may alternatively consist of atoms selected from one or more of the elements nitrogen, phosphorus, arsenic antimony and bismuth. Moreover, the total concentration of these donor impurity atoms is not limited to the preferred value of 0.0044 atomic percent, but may lie in the range 0.00066 to 0.022 atomic percent.

In addition, the crystal body need not even be constituted of n-type germanium but may alternatively be constituted of a different semiconductive material, the impurity concentration in which obeys the $N^{1/2}b$ rule set forth above. For example, the crystal body may be composed of substantially monocrystalline silicon containing atoms of one or more of the elements boron, aluminum, gallium, indium and thallium, the total concentration of these impurity atoms lying in the range 0.0019 to 0.0097 atomic percent. In a preferred embodiment having an especially low noise figure, the crystal body may be composed of substantially monocrystalline silicon containing boron in a concentration of about 0.0066 atomic percent. Where in the point-contact diode of my invention, crystal body 22 (see FIGURES 1 to 3) is composed of silicon, I prefer that whisker 24 be composed of tungsten. Where in addition the silicon is p-type, I prefer that the ohmic-contact-producing solder 34 be composed of gold, or of a lead-tin-aluminum alloy wherein the three constituents may be present in the respective proportion of 50, 47 and 3 percent-by-weight.

Furthermore where the crystal body 199 of my diode illustrated in FIGURE 4 is composed of p-type silicon and rectifying electrode 110 is a surface-barrier electrode, I prefer that the latter electrode be composed of zinc, although it may be composed of indium.

Moreover, where body 204 of my diode illustrated in FIGURE 5 is composed of p-type silicon, the alloy utilized to form the junction connection 200 therein is preferably composed of antimony and gold, in the approximate respective proportions of 99.9 and 0.1 percent by weight.

Furthermore, and referring now to the converted circuit diagrammed in FIGURE 6, it is pointed out that diode 318 may comprise a p-type semiconductive body. Where such is the case, the polarity of biasing source 314 is reversed, thereby to forward-bias the diode. Moreover the output voltage of source 314 preferably established at a value of 0.1 volt D.-C.

While I have described my invention by means of specific examples and in specific embodiments, I do not wish to be limited thereto, for obivous modifications will occur to those skilled in the art without departing from the scope of my invention.

I claim:

1. A semiconductor diode comprising: a crystal body composed of atoms of first and second substances disposed in a substantially monocrystalline arrangement, said first substance being selected from the group consisting of germanium and silicon and said second substance consisting of significant impurities of a given impurity type, said atoms of said second substance having a predetermined concentration and producing charge carriers in a density substantially equal to said concentration, said predetermined concentration being equal to that value for which monocrystalline bodies composed of said first and second substances, and in which said second substance is present in a concentration less than that producing degenerate properties in said bodies, exhibit a maximum value of the quantity $N^{1/2}b$, where N is the density and $b$ the mobility of charge carriers in said bodies for various concentrations of said second substance; said body having a region bounded by substantially plane parallel surface portions separated by a predetermined small distance, a filamentary member having a point formed on one end thereof, said point having at least transverse dimension equal to or greater than twice said predetermined small distance and being positioned abutting one of said surface portions; and means providing a substantially ohmic connection to the other of said surface portions.

2. A semiconductor diode according to claim 1, wherein said point has a generally circular periphery and wherein said least transverse dimension is the diameter of said periphery.

3. A semiconductor diode according to claim 1, said diode additionally comprising means for supporting a portion of said filamentary member remote from said one surface portion; and a body of substantially non-conductive cementitious material bonding a segment of said filamentary member intermediate the ends thereof to a part of the body surface including said one surface portion.

4. A semiconductor diode according to claim 3, whereing said point has a generally circular periphery and wherein said least transverse dimension is the diameter of said circular periphery.

5. A semiconductor diode comprising: a crystal body composed of atoms of first and second substances disposed in a substantially monocrystalline arrangement, said first substance being selected from the group consisting of germanium and silicon and said second substance consisting of significant impurities of a given impurity type, said atoms of said second substance having a predetermined concentration and producing charge carriers in a density substantially equal to said concentration, said predetermined concentration being equal to that value for which monocrystalline bodies composed of first and second substances, and in which said second substance is present in a concentration less than that producing degenerate properties in said bodies, exhibit a maximum value of the quantity $N^{1/2}b$, where N is the density and $b$ the mobility of charge carriers in said bodies for various concentrations of said second substance; said body having a region bounded by first and second substantially plane parallel surface portions separated from each other by a distance lying in the range bounded by 0.5 micron and 1 micron inclusive; a rectifying contact applied to said first surface portion, said rectifying contact having a radius lying in the range 1 micron to 125 microns inclusive; and means for providing a substantially ohmic connection to said second surface portion.

6. A semiconductor diode according to claim 5, wherein said rectifying contact comprises a whisker composed essentially of titanium and having a point formed thereon, said point having a substantially circular periphery whose radius is about 4 microns, and is positioned abutting said first surface portion.

7. A semiconductor diode according to claim 5, wherein said rectifying contact comprises a filamentary electrode bearing against said first surface portion to provide a point contact, said point contact having a generally circular periphery the radius of which lies in the range 1 to 5 microns; and wherein said diode comprises in addition means for supporting said filamentary electrode at a part thereof remote from said first surface portion, and a body of substantially non-conductive cementitious material bonding a segment of said electrode intermediate the ends thereof to a part of said surface adjacent but spaced from said point contact.

8. A semiconductor diode according to claim 7, wherein said segment of said filamentary electrode comprises an elbow adjacent said semiconductive body, and wherein said body of cementitious material bonds said elbow to said part of said surface.

9. A semiconductor diode comprising a body of substantially monocrystalline semiconductive material composed of germanium and atoms selected from the group consisting of phosphorus, arsenic, antimony and bismuth, said atoms having a concentration falling within the range 0.00066 and 0.022 atomic percent, said body having a region bounded by first and second substantially plane parallel surface portions separated from each other by a distance falling within the range 0.50 micron and 1 micron inclusive; a rectifying contact applied to said first surface portion, said rectifying contact having a generally circular periphery whose radius lies in the range 1 micron to 125 microns inclusive; and means providing a substantially ohmic connection to said second surface portion.

10. A semiconductor diode according to claim 9, wherein said rectifying contact comprises a surface-barrier contact constituted of indium.

11. A semiconductor diode according to claim 9, wherein said rectifying contact comprises a titanium whisker element.

12. A semiconductor diode according to claim 9, wherein said rectifying contact comprises indium alloyed into said germanium.

13. A semiconductor diode comprising a body of substantially monocrystalline semiconductive material composed of germanium and antimony, said antimony being present in said germanium in a concentration falling within the range 0.00066 and 0.022 atomic percent; said body having a region bounded by first and second substantially plane parallel surface portions separated from each other by a distance lying in the range of 0.50 to 1 micron inclusive; a filamentary electrode composed essentially of titanium and having a point formed thereon, said point having a substantially circular periphery the radius of which is about 4 microns, and being positioned abutting said first surface portion; and means providing a substantially ohmic connection to said second surface portion.

14. A semiconductor diode comprising a body of substantially monocrystalline semiconductive material composed of germanium and atoms selected from the group consisting of phosphorus, arsenic, antimony and bismuth, said atoms being present in said material in a concentration such that said body has a resistivity falling within the range 0.0036 ohm-centimeter to 0.013 ohm-centimeter; said body having a region bounded by first and second substantially plane parallel surface portions separated from each other by a distance lying within the range 0.5 micron to 1 micron inclusive; a rectifying contact applied to said first surface portion, said rectifying contact having a radius lying within the range 1 micron to 125 microns inclusive; and means providing a substantially ohmic electrical connection to said second surface portion.

15. A semiconductor diode comprising a body of substantially monocrystalline semiconductive material composed of germanium and atoms selected from the group consisting of phosphorus, arsenic, antimony and bismuth, said atoms being present in said material in a concentration lying with the range 0.00066 to 0.022 atomic percent; said body having a region bounded by first and second substantially plane parallel surface portions separated from each other by a distance lying within the range 0.50 to 1 micron inclusive; a filamentary electrode bearing against said first surface portion to provide a point contact, said point contact having a generally circular periphery the radius of which lies in the range of about 1 to about 5 microns inclusive; means for supporting said filamentary electrode at a part thereof remote from said first surface portion; a body of substantially non-conductive cementitious material bonding a segment of said electrode intermediate the ends thereof to a part of said surface adjacent but spaced from said point contact; and means providing a substantially ohmic connection to said second surface portion.

16. A semiconductor diode according to claim 15, wherein said segment of said filamentary electrode comprises an elbow adjacent said semiconductive body, and wherein said body of cementitious material bonds said elbow to said part of said surface.

17. A semiconductor diode comprising a body of substantially monocrystalline semiconductive material composed of germanium and atoms selected from the group consisting of phosphorus, arsenic, antimony and bismuth, said atoms being present in said material in a concentration lying within the range 0.00066 to 0.022 atomic percent, said body being bounded by a first surface and a second substantially plane surface opposing said first surface and separated therefrom by a distance substantially greater than a predetermined thickness, said body having formed in said first surface a concavity comprising a surface portion substantially plane and parallel to said second surface and separated therefrom by a distance not exceeding said predetermined thickness, and said surface portion and the part of said second surface positioned opposite said surface portion defining the boundaries of a given region of said body; a metal forming a substantially ohmic connection with said semiconductive material when alloyed therewith, said metal being positioned within said concavity in an amount sufficient substantially to fill it, and being alloyed into said surface portion of said concavity; a filamentary electrode bearing against said portion of said second surface bounding said given region, thereby providing small-area rectifying contact thereto, said rectifying contact having a generally circular periphery the radius of which is at least equal to said predetermined thickness; means for supporting a portion of said filamentary electrode remote from said second surface; and a body of substantially nonconductive cementitious material bonding a part of said filamentary electrode intermediate the ends thereof to a portion of said surface adjacent but spaced from said small-area rectifying contact.

18. A semiconductor diode according to claim 17, wherein said predetermined thickness lies within the range 0.50 to 1 micron inclusive, wherein said filamentary electrode is constituted essentially of titanium, wherein said radius of said rectifying contact is about 4 microns, and wherein said metal providing said ohmic connection is composed of lead, tin, bismuth and atoms selected from the group consisting of phosphorus, arsenic and antimony, said lead, tin and bismuth and said last-named atoms being present in said metal substantially in the respective proportions of about 40 percent by weight, about 40 percent by weight, about 15 percent by weight and about 5 percent by weight.

19. A semiconductor diode comprising a body of substantially monocrystalline semiconductive material composed of germanium and atoms selected from the group consisting of phosphorus, arsenic, antimony and bismuth, said atoms being present in said material in a concentration lying in the range 0.00066 to 0.022 atomic percent; said body having a region bounded by substantially plane parallel surface portions separated from each other by a predetermined distance, each of said portions forming a part of the bounding surface of one of two coaxial depressions respectively formed on opposing surfaces of said body; an ohmic connection applied to one of said surface portions; a surface-barrier electrode composed of indium, having a radius equal to or less than both 125 microns and the radius of said ohmic connection, positioned upon the other of said surface portions substantially coaxially with said ohmic connection, and said predetermined distance being such that substantially all of the current flowing between said ohmic connection and surface-barrier electrode in response to a forward-biasing voltage applied therebetween flows along substantially straight line paths substantially perpendicular to said connection and electrode; wire leads affixed respectively to said ohmic connection and surface-barrier electrode; and insulating means encapsulating said semiconductive body.

20. A semiconductor diode comprising a body of substantially monocrystalline semiconductive material composed of silicon and atoms selected from the group consisting of boron, aluminum, gallium, indium and thallium, said atoms being present in said material in a concentration falling within the range of 0.0019 to 0.0097 atomic percent; said body having a region bounded by first and second substantially plane parallel surface portions separated from each other by a distance falling within the range 0.5 micron and 1 micron inclusive; a rectifying contact applied to said first surface portion, said rectifying contact having a generally circular periphery the radius of which lies in the range 1 micron to 125 microns inclusive; and means providing a substantially ohmic connection to said second surface portion.

21. A semiconductor diode according to claim 20, wherein said rectifying contact comprises a surface-barrier electrode constituted of zinc.

22. A semiconductor diode according to claim 20, wherein said rectifying contact comprises a tungsten whisker element.

23. A semiconductor diode according to claim 20, wherein said rectifying contact comprises a gold-antimony alloy alloyed into said silicon.

24. A semiconductor diode comprising a body of substantially monocrystalline semiconductive material composed of silicon and atoms selected from the group consisting of boron, aluminum, gallium, indium and thallium, said atoms being present in said material in a concentration falling within the range 0.0019 to 0.0097 atomic percent; said body having a region bounded by first and second substantially plane parallel surface portions separated from each other by a distance lying in the range of 0.5 to 1 micron inclusive; a filamentary electrode composed essentially of tungsten and having a point formed on one end thereof, said point having a substantially circular periphery, the radius of which is about 4 microns, and being positioned abutting said first surface portion; and means providing a substantially ohmic connection to said second surface portion.

25. A semiconductor diode comprising a body of substantially monocrystalline semiconductive material composed of silicon and atoms selected from the group consisting of boron, aluminum, gallium, indium and thallium, the concentration of said atoms in said material being such that said body exhibits a resistivity falling within the range 0.011 to 0.034 ohm-centimeter; said body having a region bounded by first and second substantially plane parallel surface portions separated from each other by a distance lying within the range 0.5 micron to 1 micron inclusive; a rectifying contact applied to said first surface portion, said rectifying contact having a radius lying within the range 1 micron to 125 microns inclusive; and means providing a substantially ohmic electrical connection to said second surface portion.

26. A semiconductor diode comprising a body of substantially monocrystalline semiconductive material composed of silicon and atoms selected from the group consisting of boron, aluminum, gallium, indium and thallium, said atoms being present in said material in a concentration falling within the range 0.0019 to 0.0097 atomic percent; said body having a region bounded by first and second substantially plane parallel surface portions separated from each other by a distance lying within the range 0.5 micron to 1 micron inclusive; a filamentary electrode bearing against said first surface portion to provide a point contact, said point contact having a generally circular periphery the radius of which lies in the range of about 1 to about 5 microns inclusive; means for supporting said filamentary electrode at a part thereof remote from said first surface portion; a body of substantially non-conductive cementitious material bonding a segment of said electrode intermediate the ends thereof to a part of said surface adjacent but spaced from said point contact; and means providing a substantially ohmic connection to said second surface portion.

27. A semiconductor diode according to claim 26, wherein said segment of said filamentary electrode comprises an elbow adjacent said semiconductive body, and wherein said body of cementitious material bonds said elbow to said surface part.

28. A semiconductor diode comprising a body of substantially monocrystalline semiconductive material composed of silicon and atoms selected from the group consisting of boron, aluminum, gallium, indium and thallium, said atoms being present in said material in a concentration falling within the range 0.0019 to 0.0097 atomic percent, said body being bounded by a first surface and a second substantially plane surface opposing said first surface and separated therefrom by a distance substantially greater than a predetermined thickness, said body having formed in said first surface a concavity comprising a surface position substantially plane and parallel to said said second surface and separated therefrom by a distance not exceeding said predetermined thickness, and said surface portion and the part of said second surface positioned opposite said surface portion defining the boundaries of a given region of said body; a metal forming a substantially ohmic connection with said semiconductive material when alloyed therewith, said metal being positioned within said concavity in an amount sufficient substantially to fill it, and alloyed into said surface portion of said concavity; a filamentary electrode bearing against said portion of said second surface bounding said given region thereby providing a small-area rectifying contact thereto, said rectifying contact having a generally circular periphery the radius of which is at least equal to said predetermined thickness; means for supporting a portion of said filamentary electrode remote from said second surface; and a body of substantially non-conductive cementitious material bonding a part of said filamentary electrode intermediate the ends thereof to a portion of said surface adjacent but spaced from said small-area rectifying contact.

29. A semiconductor diode according to claim 28, wherein said predetermined thickness lies within the range 0.50 to 1 micron inclusive, wherein said filamentary electrode is constituted essentially of tungsten, wherein said radius of said rectifying contact is about 4 microns, and wherein said metal providing said ohmic connection is gold.

30. A semiconductor diode comprising a body of substantially monocyrstalline semiconductive material composed of silicon and atoms selected from the group consisting of boron, aluminum, gallium, indium and thallium, said atoms being present in said material in a concentration falling within the range 0.0019 to 0.0097 atomic percent; said body having a region bounded by substantially plane parallel surface portions separated from each other by a predetermined distance, each of said portions forming a part of the bounding surface of one of two coaxial depressions respectively formed on opposing surfaces of said body; an ohmic connection applied to one of said surface portions, a rectifying connection composed of zinc, having a radius which is equal to or less than both 125 microns and the radius of said ohmic connection, positioned upon the other of said surface portions substantially coaxially with said ohmic connection; said ohmic and rectifying connections each having a generally circular periphery the radius of which exceeds said predetermined distance, and said predetermined distance being such that substantially all of the current flowing between said ohmic and rectifying connections in response to a forward-biasing voltage flows substantially along straight line paths substantially perpendicular to said connections; wire leads affixed respectively to said ohmic and rectifying connections; and insulating means encapsulating said semiconductive body.

References Cited in the file of this patent

UNITED STATES PATENTS

| | | |
|---|---|---|
| 2,751,528 | Burton | June 19, 1956 |
| 2,752,541 | Losco | June 26, 1956 |
| 2,756,374 | Colleran et al. | July 24, 1956 |
| 2,763,822 | Frola et al. | Sept. 18, 1956 |
| 2,802,159 | Stump | Aug. 6, 1957 |
| 2,806,187 | Boyer et al. | Sept. 10, 1957 |
| 2,829,992 | Gundmundsen et al. | Apr. 8, 1958 |
| 2,838,434 | Pohl | June 10, 1958 |
| 2,840,770 | Jackson | June 24, 1958 |
| 2,846,346 | Bradley | Aug. 5, 1958 |
| 2,870,052 | Rittmann | Jan. 20, 1959 |
| 2,885,571 | Williams et al. | May 5, 1959 |
| 2,885,609 | Williams et al. | May 5, 1959 |
| 2,923,868 | Giacoletto | Feb. 2, 1960 |